United States Patent [19]
Shi et al.

[11] Patent Number: 5,693,962
[45] Date of Patent: *Dec. 2, 1997

[54] FULL COLOR ORGANIC LIGHT EMITTING DIODE ARRAY

[75] Inventors: Song Q. Shi, Phoenix; Thomas B. Harvey, III, Scottsdale; Franky So, Tempe, all of Ariz.

[73] Assignee: Motorola, Schaumburg, Ill.

[*] Notice: The term of this patent shall not extend beyond the expiration date of Pat. No. 5,587,589.

[21] Appl. No.: 409,129

[22] Filed: Mar. 22, 1995

[51] Int. Cl.$^6$ .................................................. H01L 33/00
[52] U.S. Cl. ..................... 257/89; 257/40; 257/93; 257/88; 313/502; 313/503; 313/504; 313/505
[58] Field of Search ........................ 257/89, 93, 40, 257/88, 90; 313/502, 503, 504, 505, 512

[56] References Cited

U.S. PATENT DOCUMENTS

| | | | |
|---|---|---|---|
| 4,015,166 | 3/1977 | Ohshima et al. | 313/505 |
| 4,720,432 | 1/1988 | VanSlyke et al. | 257/40 |
| 4,984,034 | 1/1991 | Yamazaki | 257/93 |
| 5,276,380 | 1/1994 | Tang | 313/504 |
| 5,294,870 | 3/1994 | Tang et al. | 313/504 |
| 5,399,502 | 3/1995 | Friend et al. | 437/1 |
| 5,424,560 | 6/1995 | Norman et al. | 257/40 |

FOREIGN PATENT DOCUMENTS

| | | | |
|---|---|---|---|
| 0 349 265 | 1/1990 | European Pat. Off. | |
| 2-244673 | 9/1990 | Japan | 257/40 |

OTHER PUBLICATIONS

Levine, "Multicolor Roled Displays," *IBM Technical Disclosure Bulletin*, vol. 19, No. 12, May 1977 pp. 4814–4815.
"Electro–Luminescent Backlight for Color Displays," *IBM Technical Disclosure Bulletin*, vol. 35, No. 2, Jul. 1992, pp. 433–434.

*Primary Examiner*—Jerome Jackson
*Assistant Examiner*—John Guay
*Attorney, Agent, or Firm*—Eugene A. Parsons

[57] ABSTRACT

An organic full color light emitting diode array including a plurality of spaced apart, light transmissive electrodes formed on a substrate, a plurality of cavities defined on top of the electrodes and three electroluminescent media designed to emit three different hues deposited in the cavities. A plurality of spaced metallic electrodes arranged orthogonal to the transmissive electrodes and formed to seal each of the cavities, thereby, sealing the electroluminescent media in the cavities, with a light transmissive anodic electrode at the bottom of each cavity and an ambient stable cathodic metallic electrode on the top of each cavity. Methods of fabrication of a full color organic light emitting diode array are also disclosed.

17 Claims, 1 Drawing Sheet

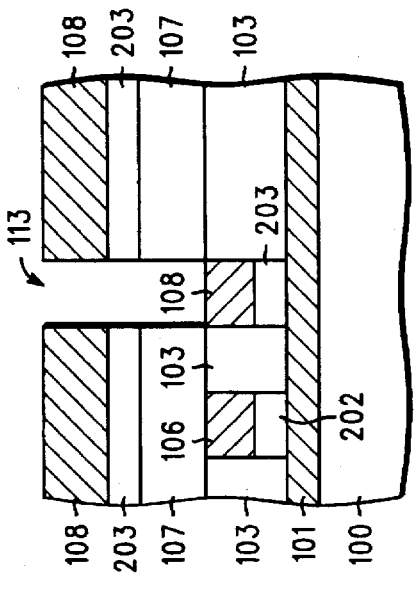
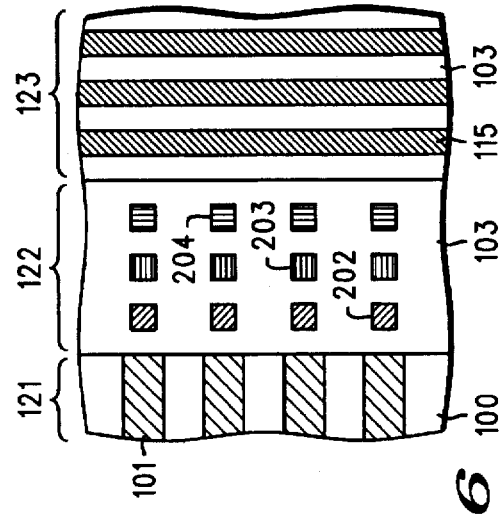
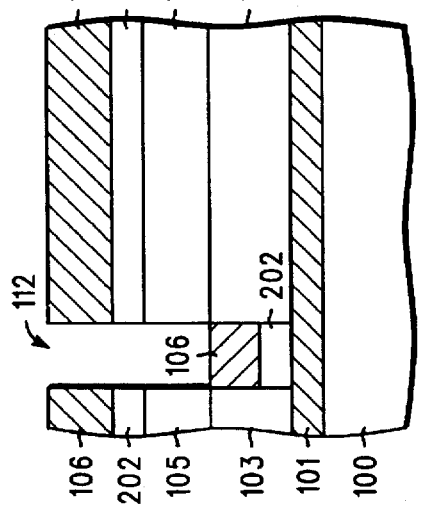
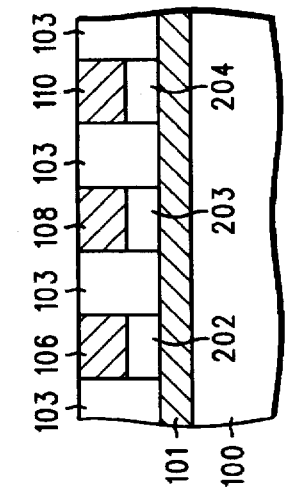
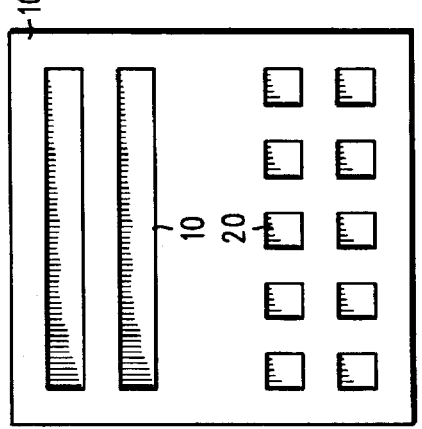
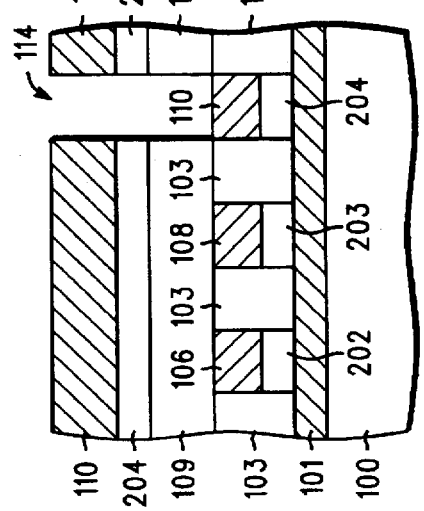

FULL COLOR ORGANIC LIGHT EMITTING DIODE ARRAY

RELATED APPLICATIONS

A U.S. patent application entitled "Two Dimensional Organic Light emitting diode Array for High Density Information Imaging Manifestation Apparatus", filed of even date herewith, bearing Ser. No. 08/408,677, and assigned to the same assignee.

FIELD OF THE INVENTION

The present invention relates to organic light emitting diode image manifestation apparatus and to a novel method of fabrication of a full color organic light emitting diode (LED) array for image manifestation apparatus.

BACKGROUND OF THE INVENTION

An organic LED array for image display applications is composed of a plurality of organic light emitting pixels arranged in rows and columns. To generate a full color display from a thin film electroluminescent array, there are two primary technologies known in the prior art. A full color array can be achieved by constructing three sub-pixels in one pixel, each sub-pixel emitting red, green or blue. This technology is generally utilized in cathode-ray-tube color displays. An alternative full color array makes use of a white emitter as a backlight in conjunction with a color filter array containing pixels patterned into red, green, and blue sub-pixels. The second technology to generate full color has been widely used in full color liquid crystal displays.

In a full color organic electroluminescent display, the color filter based technology is generally considered less favorable due to the luminescent efficiency limits of most organic LED devices.

In a full color array, each individual organic light emitting pixel is divided into red, green and blue sub-pixels. Each sub-pixel is generally constructed with a light transmissive first electrode, an organic electroluminescent medium deposited on the first electrode, and a metallic electrode on top of the organic electroluminescent medium. The color of the sub-pixel is determined by the electroluminescent medium employed. The electrodes connect the pixels to form a two-dimensional X-Y addressing pattern. In practice, the X-Y addressing pattern is achieved by patterning the light transmissive electrodes in the X direction and patterning the metallic electrodes in the Y direction, with X and Y directions being perpendicular to each other. The patterning of the electrodes is usually accomplished by either shadow mask or etching techniques. Due to the technical limits of shadow masks, only etching processes are being utilized for image displays, which have generally sub-pixel pitches less then 0.2 mm.

Depending on the medium used in etching processes, the etching technique can be divided into two categories: wet and dry. While wet etching is performed in an acidic liquid medium, dry etching is usually carried out in a plasma atmosphere.

Scozzafava in EP 349,265 disclosed an organic electroluminescent image display device and a process for its fabrication based on a wet etching technology. The metallic electrodes used for cathode contacts in organic LEDs usually contain a stable metal and a highly reactive metal (with work function less then 4 eV) that can not survive in the acid etching processes.

The dry etching processes for metallic electrodes in an organic LED array is also problematic. The high temperature (>200° C.) and reactive ion atmosphere required in dry etching process may affect the integrity of the organic materials as well as the active metal contained in the metallic electrodes in an organic LED array.

Tang in U.S. Pat. No. 5,276,380 discloses a shadow wall method to fabricate the two-dimensional array without the need of the etching of the metallic electrodes. The shadow wall method includes: patterning the transparent electrode first; building dielectric walls that are orthogonal to the transparent electrodes, capable of shadowing an adjacent pixel area, and with a height exceeding the thickness of the organic medium; depositing organic electroluminescent medium; and depositing the cathode metals from an angle of 15° to 45° with respect to the deposition surface. Since the height of the dielectric walls exceeds the thickness of the organic medium, isolated parallel metal stripes are formed. Thus, a X-Y addressable array is achieved without the need of metal etching. Though this method seems to be viable for metal patterning, it is limited to certain pitch dimensions, and potentially could introduce leakage in pixels in the array.

Thus, it would be advantageous to provide a full color organic LED array which overcomes these problems.

Accordingly, it is a purpose of this invention to provide a novel method of fabrication of a full color organic LED array for image display applications.

It is another purpose of this invention to provide a cavity structure in which a full color organic LED array is constructed.

It is a further purpose of this invention to provide a passivated full color organic LED array for image display applications with improved reliability.

SUMMARY OF THE INVENTION

The above problems and others are at least partially solved and the above purposes and others are realized in a full color organic light emitting diode array including an electrically insulative, light transmissive substrate having a planar surface. A plurality of laterally spaced, light transmissive, electrically conductive strips are arranged in rows on the surface of the substrate with portions of the surface of the substrate exposed therebetween and a layer of dielectric medium is deposited over the conductive strips and the portions of the surface of the substrate. The dielectric medium is etched to define a plurality of cavity structures, with each cavity structure defining a sub-pixel, and the plurality of cavity structures being positioned in rows in overlying relationship to the plurality of conductive strips with individual cavity structures positioned in overlying relationship to an associated conductive strip so as to expose a portion of the conductive strip. Three electroluminescent media, each including at least a layer of active emitter material and a layer of a low work function metal are laterally and alternatively deposited in the cavity structures on the exposed associated conductive strip, with all of the cavity structures in each individual row containing only one kind of the three electroluminescent media. An ambient stable metal is positioned in sealing engagement over the cavity structures and connected to form a plurality of laterally spaced, parallel, metallic strips arranged in columns orthogonal to the conductive strips to complete the array.

Methods of fabrication of an full color organic light emitting diode array are also disclosed wherein some of the above steps are repeated to form two or three groups of sub-pixels.

BRIEF DESCRIPTION OF THE DRAWING

Referring to the drawings, wherein like characters indicate like parts throughout the figures:

FIG. 1 is a plan view of different cavity structures intentionally depicted on the same substrate to illustrate their dimensional difference;

FIGS. 2, 3, 4 and 5 are cross sectional views at successive stages of fabrication of a pixel with three sub-pixels of an organic LED array embodying the present invention; and FIG. 6 is a top plan view of the organic LED array with portions broken away for ease of visualization.

DESCRIPTION OF THE PREFERRED EMBODIMENTS

Since device feature dimensions are often in submicrometer ranges, the drawings are scaled for ease of visualization rather than dimensional accuracy. Referring specifically to FIG. 1, a plan view of trenches 10 and wells 20 are intentionally depicted on the same substrate to illustrate their dimensional difference. Both the trench and the well structures are generally formed by photolithographically patterning a dielectric layer 103 that has been deposited on top of light transmissive, conductive strips that are in turn supported by an underlying layer of transparent insulating substrate, as will be described presently.

Each trench 10 is defined as a long, narrow, straight, deep depression with four relative steep (substantially vertical) sides formed in dielectric layer 103. Each trench 10 typically takes the shape of a rectangular parallelepiped as shown in FIG. 1. A trench 10 generally extends across substrate 100 in a direction either perpendicular to underlying light transmissive, conductive strips 101 (see FIG. 6 for example) or parallel to and on the top of underlying light transmissive, conductive strips 101. In this specific embodiment, trenches 10 are preferably perpendicular to underlying light transmissive, conductive strips 101 so as to form a x-y addressable matrix. A plurality of pixels can be constructed in each single trench 10.

Each well 20 is defined as a hole formed in dielectric layer 103 with a rectangular, square or circular shape of opening, and steep (substantially vertical) side walls. Wells 20 are characterized by the small feature size and nearly isotropic shape of opening. A plurality of wells 20 are constructed in a row across substrate 100 in overlying relationship to light transmissive, conductive strips 101 (see FIG. 6 for example). Each well 20 defines the shape of a sub-pixel in the array. Either trenches 10 or wells 20 can be used in fabrication of a full color organic LED array for image display, as will be described presently. For convenience of further disclosure, both trenches 10 and wells 20 are hereinafter referred to in general as cavity structures, which term also includes other variations on these structures.

The LED array to be described is characterized in that the array is capable of full color image display. Each pixel is composed of three sub-pixels, each having a specific electroluminescent medium capable of emitting light of a different hue, preferably red, or green, or blue. Each sub-pixel is constructed with a cavity structure having light transmissive, conductive strips 101 at the bottom, dielectric medium on the side walls and an ambient stable metal on the top. A method of fabrication of the full color organic LED array for image display applications, in accordance with the present invention, is disclosed herein. FIGS. 2, 3, 4 and 5 are cross sectional views illustrating a single pixel with three sub-pixels of the LED array at successive stages of fabrication.

Referring to FIG. 2, the construction of a pixel begins with a relative flat, light transmissive, preferably transparent, and electrically insulative substrate 100. Substrates made of glass and/or polymeric materials can generally be used, but glass is preferred. A layer of light transmissive, electrically conductive material is deposited on the upper surface of substrate 100, which layer is selected from a variety of organic or inorganic conductors, such as conductive polyaniline (PANI), or indium-tin-oxide (ITO). The layer is then patterned by conventional lithographic techniques to form a plurality of parallel conductive strips 101 that are capable of being addressed in a row fashion (or, conversely, a column fashion if desired) and will serve as an anodic electrode in the final array.

A layer of dielectric medium 103 is deposited on top of conductive strips 101 and exposed portions of substrate 100, by techniques such as thermal evaporation, sputtering or plasma enhanced chemical vapor deposition. Dielectric medium 103 used in the construction of cavity structures can be an organic polymer or inorganic materials. It is preferred to use an inorganic dielectric material such as silicon dioxide, silicon nitride, or alumina, which is usually a better barrier to oxygen and moisture than organic polymer materials. The thickness of dielectric medium 103 determines the depth of the cavity structures and may vary from 10 µm to 0.1 µm. For easy processing, a thickness of less then 1 µm is preferred.

A layer 105 of photoresist is spin-coated on top of dielectric medium 103 and patterned with a light source through a mask (not shown). Though both positive and negative resist can be used, it is preferred to use a positive resist for its high resolution and excellent dry etching resistance. After a heat treatment, layer 105 of photoresist is developed to expose underlying dielectric medium 103. Dielectric medium 103 is then patterned by conventional wet or dry etch technique to form a cavity structure or structures 112. Dry etch is generally preferred for its anisotropic character that renders relatively straight or substantially vertical side walls.

An electroluminescent medium 202 is deposited inside cavity structure 112, and in overlying relationship to a single conductive strip of the plurality of conductive strips 101. Electroluminescent medium 202 generally consists of a layer of hole transporting material, a layer of active emitter material capable of emitting the first hue, a layer of electron transporting material and a layer of a low work functional metal as a cathode. Since these individual layers of electroluminescent material 202 are known, each individual layer is not described in detail herein.

The upper end, or opening, of cavity structure 112 is then sealed by deposition of a thick layer 106 of an ambient stable metal such as aluminum, silver, copper or gold as a cap for cavity structure 112. The thickness of layer 106 is controlled so that cavity structure 112 is just filled to the height of dielectric medium 103. A lift-off of photoresist layer 105 is performed to complete the first sub-pixel capable of emitting a first hue, red in this specific embodiment, in the pixel.

Referring to FIG. 3, the formation of a second sub-pixel is depicted. A layer 107 of photoresist is spin-coated on top of the first sub-pixel and dielectric medium 103 and patterned and developed, generally as described above. The exposed dielectric medium 103 is then patterned to form a second cavity structure or structures 113 adjacent to the first sub-pixel. An electroluminescent medium 203 is deposited in cavity structure 113 and in overlying relationship to the single conductive strip of the plurality of conductive strips 101. As explained in conjunction with electroluminescent medium 202, electroluminescent medium 203 generally consists of a layer of hole transporting material, a layer of active emitter material capable of emitting a second hue, a layer of electron transporting material and a layer of a low work function metal as a cathode. The upper end of cavity structure 113 is sealed by deposition of a thick layer 108 of an ambient stable metal such as aluminum, silver, copper or gold to the height of dielectric medium 103. After lift-off is performed on photoresist 107, the construction of the second sub-pixel in the pixel, capable of emitting the second hue, in this specific embodiment green, is complete.

Referring to FIG. 4, the formation of a third sub-pixel is depicted. A layer 109 of photoresist is spin-coated on top of the first and second sub-pixels and dielectric medium 103 and patterned and developed, generally as described above. The exposed dielectric medium 103 is then patterned to form a third cavity structure or structures 114 adjacent to the first and second sub-pixels. An electroluminescent medium 204 is deposited in cavity structure 114 and in overlying relationship to the single conductive strip of the plurality of conductive strips 101. As explained in conjunction with electroluminescent medium 202 and 203, electroluminescent medium 204 generally consists of a layer of hole transporting material, a layer of active emitter material capable of emitting a third hue, a layer of electron transporting material and a layer of a low work function metal as a cathode. The upper end of cavity structure 114 is sealed by deposition of a thick layer 110 of an ambient stable metal such as aluminum, silver, copper or gold to the height of dielectric medium 103. After lift-off is performed on photoresist 109, the construction of the third sub-pixel in the pixel, capable of emitting the third hue, in this specific embodiment blue, is complete.

The complete pixel capable of emitting three primary colors is illustrated in FIG. 5. After the lift-off of the last photoresist layer 109, the sub-pixels are then connected in a direction orthogonal to conductive strips 101 by metal strips 115. The metal strips can be formed by either lithographically patterning a blanket layer of deposited metal or depositing of metal over a resist-masked pattern followed by a lift-off process.

FIG. 6 is a plan view of the completed organic LED array with portions broken away to illustrate three different stages of the fabrication. Proceeding from left to right in FIG. 6, an area 121 illustrates the LED array at a stage where patterned light transmissive, conductive strips 101 have been formed on light transmissive, electrically insulative substrate 100. A central area 122 in FIG. 6 illustrates the stage where individual sub-pixels of electroluminescent media 202, 203, and 204 capable of emitting three hues, in this embodiment the primary colors red, green and blue, have been deposited in cavity structures 112, 113 and 114, respectively. An area 123 illustrates the array after a plurality of parallel, laterally spaced, ambient stable metal strips 115 have been selectively deposited on top of the cavity structures 112, 113 and 114, to connect the sub-pixels in columns as cathodic electrodes.

While the above cavity structures 112, 113 and 114 have been depicted as wells, it should be understood that an array of trench structures can be fabricated in similar fashion, with the exception that the orientation of the trench structures is, preferably, perpendicular to and across all conductive strips 101 in order to form a x-y addressable matrix.

The number of pixels and the sub-pixel pitch, that is the width of a cavity structure, in an array, needed for an image display application, are dependent upon the resolution and size of the display required for the specific application. For example, a minimum of 640×480 pixels, each having three sub-pixels and with a sub-pixel pitch less than 0.1 mm, are needed for satisfactory resolution in a 13 inch diagonal color VGA type of display. The pixel pitch is confined only by the limit of lithography technology, which is around 0.5 µm in current manufacturing technology.

The array disclosed in this embodiment has inherently superior stability over any of the arrays disclosed in the prior art. The organic electroluminescent medium and the cathode contact of low work function metal in each sub-pixel (well structure) or row of sub-pixels (trench structure) are enclosed in a well or trench by a light transmissive first electrode at the bottom, a dielectric medium on the side and an ambient stable metal cap on the top. The disclosed cavity structures significantly reduce the ambient (oxygen and moisture) degradation of the display elements.

The materials used as the electroluminescent medium in the array disclosed in this invention can take any of the forms of organic EL devices disclosed in the prior art. The electroluminescent medium generally consists of a layer of hole transporting material, a layer of active emitter, a layer of electron transporting material and a layer of low work functional metal as cathode. Organic, organometallic, polymeric or any combination of those materials can be used as hole transporting materials, active emitters and electron transporting materials. It will of course be understood that in some special applications either or both of the hole transporting material and the electron transporting material may be eliminated, although this will generally result in poor light emission.

To achieve the three primary color emissions, namely, red, green and blue, three different active emitters that would generate the desired color emissions in a pixel can be utilized. In each active emitter layer, a fluorescent dopant used for enhancement of the emission efficiency for each individual color in a sub-pixel can also be incorporated. Alternatively, a single emitter capable of blue emission is used as host emitters in all three sub-pixels. To achieve the three primary color emissions, three sub-pixels are then doped with three guest dopants of efficient fluorescent dyes capable of red, green and blue emissions, respectively. The guest dopants act as the real emitters while the host emitter serves as an excited energy transporting medium.

The organic electroluminescent media are deposited by vacuum evaporation when sublimable materials are used. They can also be deposited by other techniques such as sputtering, thermal evaporation, injection-fill, spin-coating, roll-coating, dip-coating or doctor-blading from a suitable solution when a polymeric material is used. A mixture of the above-mentioned techniques may be needed in cases where a heterostructure array composed of both sublimable materials and polymers is to be built.

At present time, metals with a work function less than 4.0 eV, e.g. lithium, magnesium, indium, calcium etc., are generally used as the cathode material in order to achieve an efficient LED display. It is conceivable in the near future, metals with work function greater than 4.0 eV may also be employed as the cathode material to yield an efficient LED display as the electron injecting and transporting abilities of the materials used in the electroluminescent media improve.

In operation a pattern of light emission from the LED array can be seen from the bottom surface of transparent substrate 100. The LED array is driven to emit light by a programmed electronic driver, which sequentially addresses one row of sub-pixels at a time and repeats the addressing sequence at such a rate that the interval between repeated addressing of the same row is less than the detection limit of the human eye, typically less than 1/60th of a second. The eye sees an image formed by the light emission from all of the addressed rows, though the device at any moment is emitting from only one row.

Colors for an image are generated by addressing a combination of sub-pixels in each pixel, generally as follows:

(1) address one sub-pixel to emit red light;
(2) address one sub-pixel to emit green light;
(3) address one sub-pixel to emit blue light;
(4) simultaneously address two sub-pixels that emit red and green to generate a perception of yellow;
(5) simultaneously address two sub-pixels that emit red and blue to generate a perception of purple;
(6) simultaneously address two sub-pixels that emit blue and green to generate a perception of blue-green;
(7) simultaneously address all sub-pixels to generate white light; and
(8) address none of the sub-pixels to generate a black background.

It should be emphasized that the fabrication methods disclosed in this invention for an organic LED array capable of full color are also applicable to the fabrication of an array for either a monochrome or a multicolor (other than full color) image. With the selection of either monochrome or multicolor electroluminescent media in a pixel, an array for a monochrome or a multicolor image display application can be fabricated by the same methods disclosed in the foregoing.

Thus, a full color organic LED array for image display and its fabrication methods are disclosed. While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A full color organic light emitting diode array comprising:

an electrically insulative, light transmissive substrate having a planar surface;

a plurality of laterally spaced, light transmissive, electrically conductive strips arranged in rows on the surface of the substrate with portions of the surface of the substrate exposed therebetween;

a layer of dielectric medium deposited over the conductive strips and the portions of the surface of the substrate;

a plurality of cavity structures defined by the dielectric medium and each cavity structure defining a sub-pixel, the plurality of cavity structures being positioned in rows in overlying relationship to the plurality of conductive strips with individual cavity structures positioned in overlying relationship to an associated conductive strip so as to expose a portion of the conductive strip;

three electroluminescent media, each including at least a layer of active emitter material and a layer of a low work function metal, laterally and alternatively deposited in the cavity structures on the exposed associated conductive strip, with all cavity structures in each individual row containing only one kind of the three electroluminescent media; and an ambient stable metal positioned in sealing engagement over the cavity structures and connected to form a plurality of laterally spaced, parallel, metallic strips arranged in columns orthogonal to the conductive strips.

2. A full color organic light emitting diode array as claimed in claim 1 wherein the substrate includes one of an organic polymer and an inorganic material.

3. A full color organic light emitting diode array as claimed in claim 2 wherein the substrate includes glass.

4. A full color organic light emitting diode array as claimed in claim 1 wherein the conductive strips include one of an organic polymer and an inorganic material.

5. A full color organic light emitting diode array as claimed in claim 4 wherein the conductive strips include indium-tin-oxide.

6. A full color organic light emitting diode array as claimed in claim 1 wherein the dielectric medium defining the cavity structures includes one of an organic polymer and an inorganic material.

7. A full color organic light emitting diode array as claimed in claim 6 wherein the dielectric medium defining the cavity structures includes an inorganic material including one of silicon dioxide, silicon nitride, and alumina.

8. A full color organic light emitting diode array as claimed in claim 1 wherein the thickness of the dielectric medium is in a range of 10 µm to 0.1 µm.

9. A full color organic light emitting diode array as claimed in claim 8 wherein the thickness of the dielectric medium is less then 1 µm.

10. A full color organic light emitting diode array as claimed in claim 1 wherein the three electroluminescent media further include a layer of hole transporting material and a layer of electron transporting material positioned to sandwich the layer of active emitter material therebetween.

11. A full color organic light emitting diode array as claimed in claim 10 wherein the layers of hole transporting material, active emitter material and electron transporting material include forms of organic, organometallic, polymeric or combinations of organic, organometallic, and polymeric material.

12. A full color organic light emitting diode array as claimed in claim 1 wherein the layer of active emitter material in each of the three electroluminescent media is selected to determine the emission hue of each said sub-pixel.

13. A full color organic light emitting diode array as claimed in claim 1 wherein the three electroluminescent media are selected to provide, in cooperation, full color emission by including three different active emitter materials that generate three primary colors, each in a different sub-pixel of a pixel.

14. A full color organic light emitting diode array as claimed in claim 1 wherein the active emitter materials of the three electroluminescent media include a single blue host emitter material which is doped in each different one of the three electroluminescent media with a different one of three guest dopants of efficient fluorescent dyes selected for three different hue emissions.

15. A full color organic light emitting diode array as claimed in claim 1 wherein the three electroluminescent media are deposited by one of the following methods: sputtering, thermal evaporation, injection-fill, spin-coating, roll-coating, dip-coating or doctor-blading.

16. A full color organic light emitting diode array as claimed in claim 1 wherein the low work function metal in each of the three electroluminescent media include one of lithium, magnesium, indium, and calcium.

17. A full color organic light emitting diode array as claimed in claim 1 wherein the ambient stable metal includes one of aluminum, silver, copper and gold.

* * * * *